(12) United States Patent
Dotta et al.

(10) Patent No.: US 6,518,090 B2
(45) Date of Patent: Feb. 11, 2003

(54) SEMICONDUCTOR DEVICE AND MANUFACTURING METHOD THEREOF

(75) Inventors: Yoshihisa Dotta, Nara (JP); Kazuo Tamaki, Soraku-gun (JP); Yasuyuki Saza, Katsushika-ku (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/000,482

(22) Filed: Dec. 4, 2001

(65) Prior Publication Data

US 2002/0076858 A1 Jun. 20, 2002

(30) Foreign Application Priority Data

Dec. 14, 2000 (JP) .......................................... 2000-380860

(51) Int. Cl.[7] .................... H01L 21/44; H01L 23/495; H01L 29/40
(52) U.S. Cl. ..................... 438/106; 438/127; 257/667; 257/783; 257/778; 257/782
(58) Field of Search ................. 438/106, 127; 257/667, 783, 778, 782

(56) References Cited

U.S. PATENT DOCUMENTS

| | | | | |
|---|---|---|---|---|
| 5,612,576 A | * | 3/1997 | Wilson et al. ............... | 257/787 |
| 5,721,450 A | * | 2/1998 | Miles .......................... | 257/667 |
| 5,834,835 A | * | 11/1998 | Maekaw ...................... | 257/680 |
| 5,874,784 A | | 2/1999 | Aoki et al. | |
| 6,054,755 A | * | 4/2000 | Takamichi et al. .......... | 257/667 |
| 6,064,111 A | * | 5/2000 | Sota et al. ................... | 257/667 |
| 6,291,895 B1 | * | 9/2001 | Taniguchi et al. ........... | 257/738 |
| 6,331,729 B1 | * | 12/2001 | Yusa et al. ................... | 257/676 |

FOREIGN PATENT DOCUMENTS

| | | |
|---|---|---|
| JP | 11-243160 A | 9/1999 |
| JP | 2000-340695 | * 8/2000 |

* cited by examiner

*Primary Examiner*—David E. Graybill
*Assistant Examiner*—James Mitchell
(74) *Attorney, Agent, or Firm*—Nixon & Vanderhye P.C.

(57) ABSTRACT

A semiconductor device includes a circuit board on which a semiconductor chip is mounted via an adhesive resin layer and through which a moisture drain hole is formed. A pit part having a width wider than a diameter of the moisture drain hole is formed in a part of the adhesive resin layer exposed in the moisture drain hole. On this account, the semiconductor device can properly drain moisture to the outside when the semiconductor device is mounted on another packaging substrate by reflowing.

21 Claims, 9 Drawing Sheets

SEMICONDUCTOR DEVICE AND MANUFACTURING METHOD THEREOF

FIELD OF THE INVENTION

The present invention relates to a semiconductor device having a package structure such as BGA (Ball Grid Array), CSP (Chip Scale Package), wherein a semiconductor chip is mounted on a circuit board through a resin layer, and a method of manufacturing the same.

BACKGROUND OF THE INVENTION

Semiconductor devices have been increasingly required to be lighter and smaller, in accordance with the recent trend that electronic devices have become lighter and smaller. Corresponding with this trend, BGA or CSP-type semiconductor devices using a sealing resin have become widely used.

Figure 8:
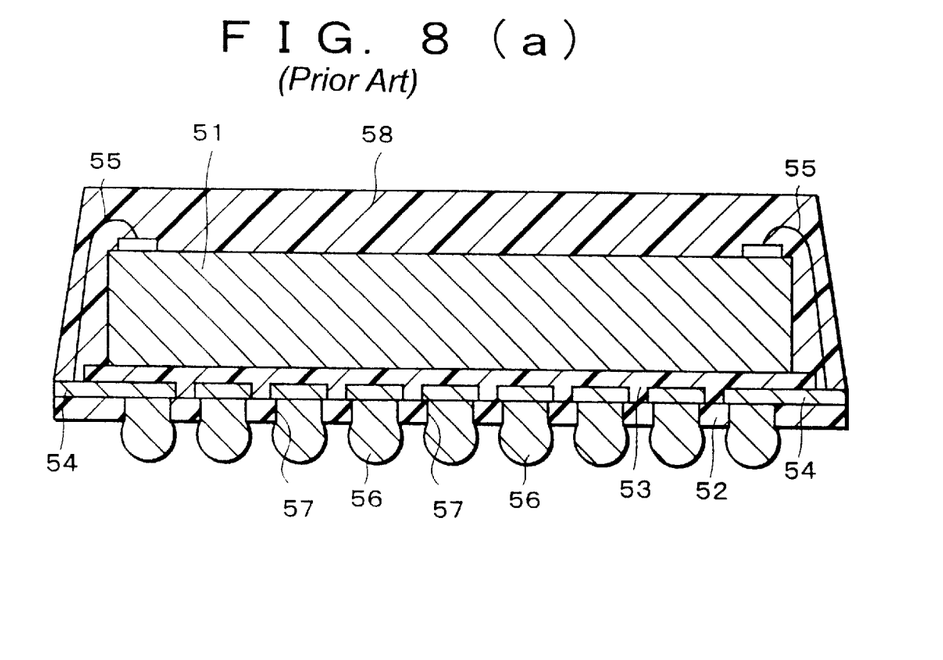
FIG. 8(a) is a vertical cross-sectional view, showing a conventional wire bonding CSP-type semiconductor device.
FIG. 8(b) is a vertical cross-sectional view, showing a conventional flip chip CSP-type semiconductor device.

FIG. 8(a) shows an example of a conventional wire bonding type CSP. This semiconductor device is arranged so that a semiconductor chip 51 is fixed on a circuit board 52 by using an adhesive film or an adhesive resin paste layer 53. The semiconductor chip 51 is connected to a metal wire 54 formed on the top surface of the circuit board 52 by a wire 55 (wire bonding) and the metal wire 54 is connected to a solder ball 56 formed on the bottom surface of the circuit board 52, through a perforation 57 formed through the circuit board 52. This semiconductor device is arranged so that a face of the circuit board 52 where the semiconductor chip is mounted is coated with a resin mold layer 58 to protect the semiconductor chip 51 and the wire 55.

FIG. 8(b) shows an example of a conventional flip chip type CSP. This semiconductor device is arranged so that the semiconductor chip 51 is fixed on the top surface of the circuit board 52 by using the adhesive resin layer 53. The adhesive resin layer 53 is fabricated from an insulating or anisotropic conductive paste or sheet. Each protrusive electrode 59 formed on an electrode (not illustrated) of the semiconductor chip 51 is connected to an electrode of the circuit board 52, and the metal wire 54 on the circuit board 52 is also connected to the solder ball 56 provided on the bottom surface of the circuit board 52 through the perforation 57 formed on the circuit board 52.

As another method to mount the semiconductor chip 51 on the circuit board 52 by a flip chip connection, there is a method in which a liquid sealing resin is injected into an interface between the semiconductor chip 51 and the circuit board 52, after the semiconductor chip 51 is connected to the circuit board 52 by the flip chip connection. In the cases of these flip chip connections, the resin mold layer 58 is not necessary.

When the semiconductor devices shown in FIGS. 8(a) and (b) are used, the device is mounted on another packaging substrate by reflowing. However, the constituents of the semiconductor device such as a base material forming the circuit board 52 and a resin take up moisture in the air. The moisture is vaporized and expands as the temperature rises at the moment of mounting by reflowing, so this may bring about the so-called popcorn phenomenon that causes swelling and falling off inside the semiconductor device. In this manner, the moisture in the semiconductor device has been a problem.

Figure 9:
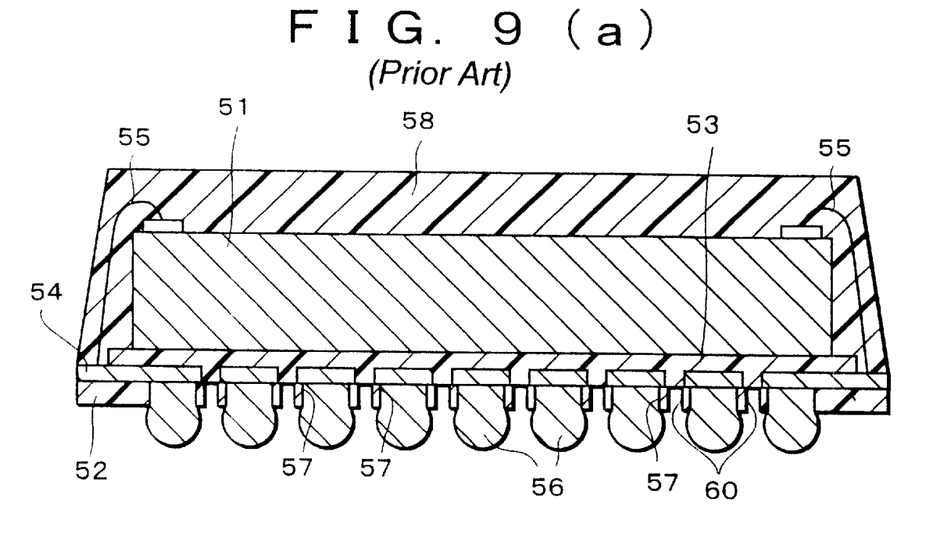
FIG. 9(a) is a vertical cross-sectional view showing a moisture drain hole, penetrating a circuit board of the semiconductor device shown in FIG. 8(a), being formed.
FIG. 9(b) is a vertical cross-sectional view showing a moisture drain hole, penetrating the circuit board and an adhesive layer of the semiconductor device shown in FIG. 8(a), being formed.

Thus, as FIG. 9(a) shows, a technique (first conventional technique) of Japanese Laid-Open Patent Application No. 9-121002/1997 (Tokukaihei 9-121002; published on May 6, 1997) is arranged so that a small hole, i.e. moisture drain hole 60 penetrating the circuit board 52 is formed in an area of the circuit board 52 where the adhesive resin layer 53 is exposed, and the moisture accumulated in the semiconductor device is effectively drained through the moisture drain hole 60.

Meanwhile, as FIG. 9(b) shows, a technique (second conventional technique) of Japanese Laid-Open Patent Application No. 11-243160/1999 (Tokukaihei 11-243160; published on Sep. 7, 1999) proposes such an arrangement that a small hole, i.e. moisture drain hole 61, penetrating the circuit board 52 and the adhesive resin layer 53 from the bottom surface of the circuit board 52, is formed to make it easy to drain the moisture through th e moisture drain hole 61.

However, the conventional semiconductor devices have following problems. The first conventional technique is arranged so that the moisture drain hole 60 is formed before the semiconductor chip 51 is mounted on the circuit board 52. In this kind of arrangement, fluid adhesives such as an adhesive like a paste or resins that temporarily lose solidity so as to becoming fluid when heated cannot be used as materials for the adhesive resin layer 53 for mounting the semiconductor substrate 51 on the circuit board 52. This is because the adhesive or the resin could leak through the moisture drain hole 60 or the hole 60 could be blocked by the leaking agent. For the same reasons, in the case of the flip chip connection, an aerotropic conductive adhesive film/paste, a thermosetting adhesive, or an underfill agent cannot be used as the adhesive resin layer 53. As a result, available materials and variety of the manufacturing process have become severely limited.

In the meantime, the second conventional technique is arranged so that the moisture drain hole 61 is formed through the circuit board 52 and the adhesive resin layer 53 after the semiconductor chip 51 is mounted on the circuit board 52, to solve these problems.

However, in this case it is difficult to determine the endpoint in the penetrating operation, when the moisture drain hole 61 is formed from the bottom surface of the circuit board 52 by using a drill or a laser beam. That is to say, provided that the semiconductor device is the wire bonding type shown in FIG. 9(b), on the one hand, it is possible to set the endpoint as the penetrating operation ends when the laser beam reaches the back of the semiconductor chip 51, since a non-connecting surface of the semiconductor chip 51 faces the circuit board 52. On the other hand, in the case of a flip-chip-type semiconductor device, since the laser beam reaches a connecting surface (top surface) of the semiconductor chip 51, the laser beam does harm to characteristics of the semiconductor device, because a connecting surface of the semiconductor chip 51 faces the circuit board 52. Moreover, moisture resistance of the semiconductor chip 51 has become reduced, because the connecting surface of the semiconductor chip 51 is exposed to the outside air through the moisture drain hole 61.

In both of the conventional techniques, performance of draining moisture from the semiconductor device depends on the diameter of the moisture drain holes 60 and 61, so the larger the diameter, the better moisture draining performance. Meanwhile, the diameter of the moisture drain holes 60 and 61 are determined in accordance with the diameter of the laser beam or the drill forming the holes 60 and 61. For instance, when the laser beam which can do the operation efficiently is used, it is difficult to make a beam with large diameter and thus making the moisture drain holes 60 and 61 have large diameter is also difficult. In the meantime, when the drill is used, while making the moisture drain holes 60 and 61 with large diameter itself is easy, it is difficult to drain moisture adequately by making the diameter of the moisture drain holes 60 and 61 be adequately large, because relationships such as tradeoffs between the moisture drain hole and the wiring pattern (metal wire 54) formed on the circuit board 52 must be considered.

Therefore, the present invention aims to provide a semiconductor device capable of efficiently draining moisture from the device through a moisture drain hole formed through a circuit board, at the moment of reflowing for mounting the semiconductor device on another mounting substrate. Furthermore, the present invention aims to provide a manufacturing method of a semiconductor device in which:

a semiconductor chip is protected from a penetrating operation to form the moisture drain hole through the circuit board; and also materials of intermediate layers such as an adhesive resin layer, situated between the circuit board and a semiconductor chip, can be prevented from leaking through the moisture drain hole of the circuit board, when the semiconductor chip is mounted on the circuit board.

SUMMARY OF THE INVENTION

To solve the problems above, a semiconductor device of the present invention includes:

a circuit board provided with a moisture drain hole formed therethrough and a semiconductor chip mounted thereon via an intermediate layer (for instance an adhesive resin layer for fixing the semiconductor chip on the circuit board or a resin layer such as a solder resist layer), wherein a pit part having a width greater than a diameter of the moisture drain hole is formed in a part of the intermediate layer facing the moisture drain hole.

According to this arrangement, for instance, moisture contained in:

a mold resin layer for sealing the semiconductor chip;

the adhesive resin layer or the solder resist layer, the intermediate layer between the circuit board and the semiconductor chip, fixing the semiconductor chip on the circuit board; and the circuit board on which the semiconductor chip is mounted, is drained as, for instance, steam, through the pit part formed in the intermediate layer and the moisture drain hole formed through the circuit board, when, for instance, the semiconductor device is mounted on another packaging substrate by reflowing.

In this case, since the width of the pit part formed in the intermediate layer is wider than the diameter of the moisture drain hole formed through the circuit board, draining moisture can be done efficiently without enlarging the diameter of the moisture drain hole, compared to the case when the width of the pit part is as wide as the diameter of the moisture drain hole. This makes it possible to properly prevent, for instance, the intermediate layer or the mold resin from peeling off from the circuit board, which is caused by the expansion of the steam generated in the process of reflowing inside the semiconductor device.

A manufacturing method of the semiconductor device of the present invention, arranged so that a semiconductor chip is mounted on a face of the circuit board via an intermediate layer (for instance, an adhesive resin layer for fixing the semiconductor chip on the circuit board and a resin layer such as a solder resist layer) a moisture drain hole is formed through the circuit board, includes the steps of:

(a) forming a tentative protective wire for covering a mouth of the moisture drain hole opened on the face on an area of the face where the moisture drain hole is formed;

(b) after step (a), mounting the semiconductor chip on the face via the intermediate layer;

(c) after step (a), forming the moisture drain hole through the circuit board from a face, of the circuit board, opposite to the face; and (d) after step (b), removing the tentative protective wire through the moisture drain hole.

According to this arrangement, in step (a), a tentative protective wire, covering a mouth of the moisture drain hole opened on the face, is formed on an area of the face where the moisture drain hole is formed, then in step (b) after step (a), the semiconductor chip is mounted on the face via the intermediate layer. Then in step (c) after step (a) , the moisture drain hole is formed through the circuit board from a face, of the circuit board, opposite to the face. The moisture drain hole is formed using a laser beam, and the formation thereof ends when the laser beam penetrates the circuit board and reaches the tentative protective wire. Then in step (d) after step (b), the tentative protective wire is removed through the moisture drain hole. This is done through the moisture drain hole by, for instance, etching. The pit part, linked with the moisture drain holes and shaped like the tentative protective wire, is formed as a result of these steps.

Consequently, it is possible in step (b) to prevent materials contained in the intermediate layer, for instance, the adhesive resin for fixing the semiconductor chip on the circuit board and resin materials such as the solder resist, from flowing out through the moisture drain hole.

Moreover, when the laser beam is used to form the moisture drain hole in the circuit board in step (c), it is easy to determine the endpoint in the penetrating operation by the laser beam, since the operation is supposed to end when the laser beam penetrates the circuit board and reaches the tentative protective wire. This prevents the semiconductor chip from being damaged and features thereof from being deteriorated due to projection of the laser beam thereon. Moreover, it is possible to prevent degradation of moisture resistance of the semiconductor chip due to the exposure to the outside-air.

Furthermore, the tentative protective wire is formed for covering a mouth of the moisture drain hole opened on the face for mounting the semiconductor chip so that the pit part formed by removing the tentative protective wire should have a width wider than the diameter of the moisture drain hole. Thus this makes it possible to drain moisture through the pit part and the moisture drain hole of the semiconductor device efficiently without enlarging the diameter of the moisture drain hole, compared to the case when the width of the pit part is as wide as the diameter of the moisture drain hole. Then this makes it possible to properly prevent, for instance, the intermediate layer or the mold resin from peeling off from the circuit board, which is caused by the expansion of the steam generated in the process of reflowing inside the semiconductor device.

A manufacturing method of a semiconductor device in accordance with the present invention including a circuit board provided with a moisture drain hole formed therethrough and a semiconductor chip mounted on a face thereof via an intermediate layer (for instance, an adhesive resin layer for fixing the semiconductor chip on the circuit board and a resin layer such as a solder resist layer), includes the steps of:

(a) forming the moisture drain hole on the face;
(b) after step (a), forming on the face a tentative protective wire for covering a mouth of the moisture drain hole opened on the face;
(c) after step (b), mounting the semiconductor chip on the face via the intermediate layer; and
(d) after step (c), removing the tentative protective wire through the moisture drain hole.

According to this arrangement, it is possible in step (c) to prevent materials, for instance, the adhesive resin for fixing the semiconductor chip on the circuit board and resin materials such as the solder resist, contained in the intermediate layer from flowing out through the moisture drain hole, since the tentative protective wire covers a mouth of the moisture drain hole opened on the face.

Moreover, carrying out step (a) before step (c) prevents the semiconductor chip from being damaged and features thereof from being deteriorated due to projection of a laser beam thereon, when, for instance, the moisture drain hole is formed using a laser beam. Moreover, it is possible to prevent degradation of moisture resistance of the semiconductor chip due to the exposure to the outside-air.

Furthermore, the tentative protective wire is formed for covering a mouth of the moisture drain hole opened on the face for mounting the semiconductor chip so that the pit part formed by removing the tentative protective wire should have a width wider than the diameter of the moisture drain hole. Thus it is possible to drain moisture through the pit part and the moisture drain hole of the semiconductor device efficiently without enlarging the diameter of the moisture drain hole, compared to the case when the width of the pit part is as wide as the diameter of the moisture drain hole. This makes it possible to properly prevent, for instance, the intermediate layer or the mold resin from peeling off from the circuit board due to the expansion of the steam generated in the process of reflowing inside the semiconductor device.

A manufacturing method of a semiconductor device of the present invention including a circuit board provided with moisture drain hole formed therethrough and a semiconductor chip mounted on a face thereof via an intermediate layer (for instance an adhesive resin layer for fixing the semiconductor chip on the circuit board or a resin layer such as a solder resist layer), includes the steps of:

(a) forming a tentative protective wire and the moisture drain hole, the tentative protective wire being formed for covering a mouth of the moisture drain hole opened on the face, and the moisture drain hole being formed through the circuit board;
(b) after step (a), mounting the semiconductor chip on the face via an intermediate layer;
(c) after step (b), removing the tentative protective wire through the moisture drain hole.

According to this arrangement, the tentative protective wire is formed for covering a mouth of the moisture drain hole opened on the face, and the moisture drain hole is formed through the circuit board, in step (a). Either of forming the tentative protective wire and forming the moisture drain hole can be done before the formation of the other. Then in step (b) after step (a), the semiconductor chip is mounted on the face via an intermediate layer, and in step (c) after step (b), the tentative protective wire is removed by, for instance, etching through the moisture drain hole.

Consequently, it is possible in step (b) to prevent materials, for instance, the adhesive resin for fixing the semiconductor chip on the circuit board and resin materials such as the solder resist, contained in the intermediate layer from flowing out through the moisture drain hole, since the tentative protective wire covers a mouth of the moisture drain hole opened on the face.

Moreover, carrying out step (a) before step (b) prevents the semiconductor chip from being damaged and features thereof from being deteriorated due to projection of a laser beam thereon, when, for instance, the moisture drain hole is formed using a laser beam. Moreover, it is possible to prevent degradation of moisture resistance of the semiconductor chip due to the exposure to the outside-air.

Furthermore, the tentative protective wire is formed for covering a mouth of the moisture drain hole opened on the face for mounting the semiconductor chip so that the pit part formed by removing the tentative protective wire should have a width wider than the diameter of the moisture drain hole. Thus it is possible to drain moisture through the pit part and the moisture drain hole of the semiconductor device efficiently without enlarging the diameter of the moisture drain hole, compared to the case when the width of the pit part is as wide as the diameter of the moisture drain hole. This makes it possible to properly prevent, for instance, the intermediate layer or the mold resin from peeling off from the circuit board due to the expansion of the steam generated in the process of reflowing inside the semiconductor device.

For a fuller understanding of the nature and advantages of the invention, reference should be made to the ensuing detailed description taken in conjunction with the accompanying drawings.

BRIEF DESCRIPTION OF THE DRAWINGS

FIG. 1(*a*) is a vertical cross-sectional view, showing an arrangement of a semiconductor device of an embodiment of the present invention.

FIG. 1(*b*) is magnified view of a moisture drain hole of the semiconductor device shown in FIG. 1(*a*).

FIG. 2(*a*) ,shows a manufacturing method of the semiconductor device shown in FIG. 1, and is a vertical cross-sectional view showing a process to form a perforation for mounting a solder ball on a circuit board.

FIG. 2(*b*) shows a manufacturing method of the semiconductor device shown in FIG. 1, and is a vertical cross-sectional view showing a process to form a metal wire and a tentative wire for forming a pit part on the circuit board.

FIG. 2(*c*) shows a manufacturing method of the semiconductor device shown in FIG. 1, and is a vertical cross-sectional view showing a process to mount a semiconductor chip on the circuit board.

FIG. 2(*d*) shows a manufacturing method of the semiconductor device shown in FIG. 1, and is a vertical cross-sectional view showing processes to connect the semiconductor chip and an electrode of the circuit board and to form an adhesive resin layer.

FIG. 2(*e*) shows a manufacturing method of the semiconductor device shown in FIG. 1, and is a vertical cross-sectional view showing processes to seal the semiconductor chip by a resin mold layer and to form the moisture drain hole of the circuit board.

FIG. 3(*a*) shows a manufacturing process of the semiconductor device following the processes in FIG. 2 (*e*), and is a vertical cross-sectional view showing a process to mount the solder ball.

FIG. 3(*b*) shows a manufacturing process of the semiconductor device following the processes in FIG. 2(*e*), and is a vertical cross-sectional view showing a process to form a pit part for draining water.

DESCRIPTION OF THE EMBODIMENTS

[Embodiment 1]

Figure 1:
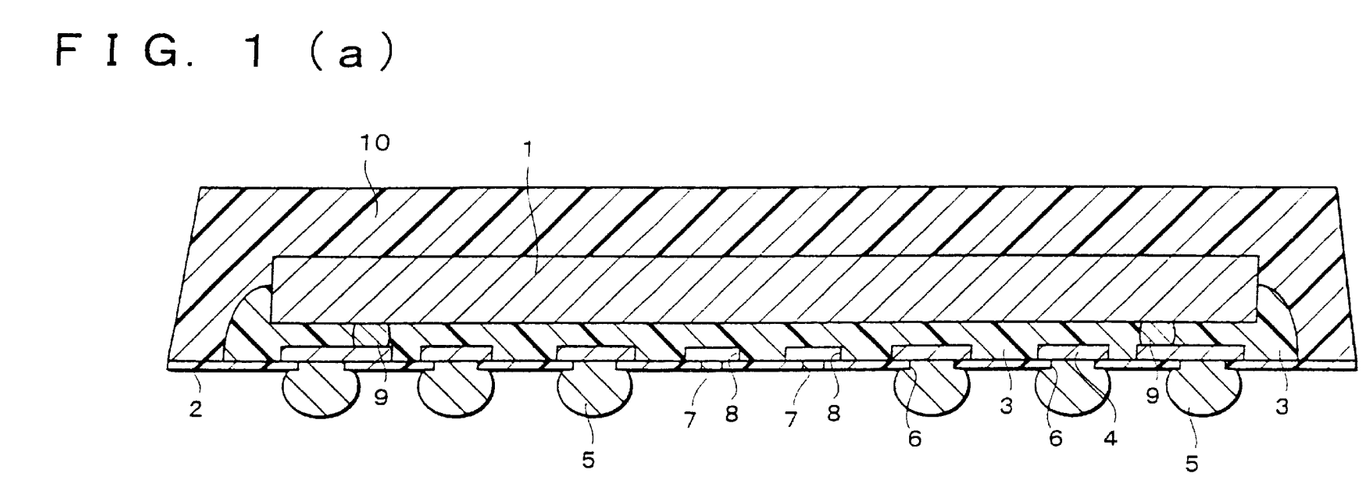
Figure 2:
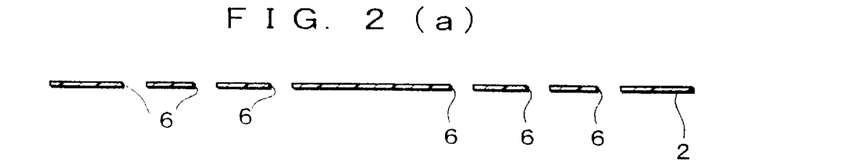
Figure 3:
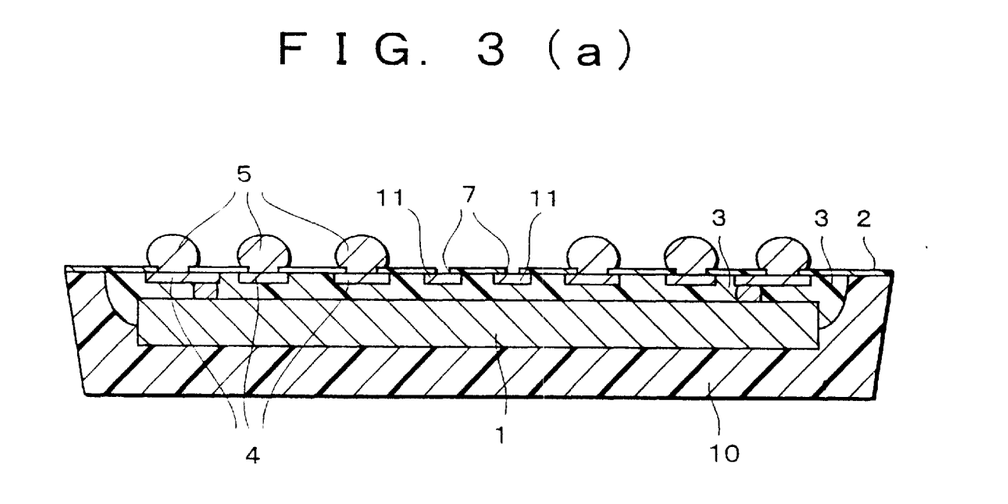

In accordance with FIGS. 1 to 3, an embodiment of the present invention is described below.

As FIG. 1(a) shows, a semiconductor device of the present invention is arranged so that a semiconductor chip 1 is fixed on the top surface of a circuit board 2 by an adhesive resin layer (intermediate layer) 3. A metal wire 4 having a specified wiring pattern is formed on the top surface of the circuit board 2, and on the bottom surface thereof, many solder balls 5 as output terminals are provided. Each solder ball 5 is connected to the corresponding metal wire 4 through a perforation 6 formed in the circuit board 2. The solder balls 5 are provided along the rim of the bottom surface of the semiconductor chip 1.

Moreover, multiple numbers of moisture drain holes 7 (perforations) are provided through the circuit board 2. A pit part 8, which is wider than the diameter of the mouth of the moisture drain hole 7, is formed in a part where the adhesive resin layer 3 is exposed in the moisture drain hole 7. The pit part 8 is shaped like a groove and connects multiple numbers of the moisture drain holes 7. The moisture drain hole 7 is formed in or around the middle of the circuit board 2, i.e. the semiconductor chip 1, and if the metal wire 4 (land) connected to the solder ball 5 is provided in the middle, the moisture drain hole 7 is formed between the metal wires 4 (land).

This semiconductor device adopts a flip chip connection, and thus a connecting surface of the semiconductor faces the circuit board 2. An electrode (not illustrated) is provided on the connecting surface, and a protrusive electrode 9 formed on the electrode is connected to an electrode of the circuit board 2. Furthermore, the semiconductor chip 1 is coated with and protected by a resin mold layer 10 provided on the top surface of the circuit board 2.

A manufacturing method of the semiconductor device arranged as above is described.

First of all, as FIG. 2(a) shows, only the perforation 6 for mounting the solder ball 5 is formed on the circuit board 2 (base material to be the circuit board 2).

Then as FIG. 2(b) shows, the metal wire 4 and a tentative protective wire 11 for forming the pit part 8 are formed on a mounting surface (top surface) of the semiconductor chip 1 of the circuit board 2 (base material to be the circuit board 2). The metal wire 4 is formed to cover the perforation 6 for mounting the solder ball 5. The tentative protective wire 11 is formed to cover an area where the moisture drain hole 7 is formed in the following process. Usually the metal wire 4 and the tentative protective wire 11 are made of copper.

Then as FIG. 2(c) shows, an anisotropic conductive adhesive resin 12 to be the adhesive layer 3 is provided on the circuit board 2. This anisotropic conductive adhesive resin 12 is generally provided as in the form of sheet or as paste. When provided as in the form of sheet, the resin 12 is compress-bonded to the circuit board 2 by a heating tool. When provided as paste, the resin 12 is provided to the circuit board 2 by dispensing or printing. The figure shows the case when provided as in the form of sheet.

Next, as FIG. 2(d) shows, a protrusive electrode 9 formed on an electrode of the semiconductor chip 1 is aligned with an electrode of the circuit board 2, then these two are caused to touch with each other and heated to harden the anisotropic conductive adhesive resin 12 for making the same be the adhesive resin layer 3.

The connection of the protrusive electrode 9 with the electrode of the circuit board 2 can be done by compress-bonding the protrusive electrode 9 to the electrode of the circuit board 2 and then heating and thus hardening the adhesive resin layer 3, when the protrusive electrode 9 is made of gold. When the protrusive electrode 9 is made of solder, the connection above can be done by melting the solder and soldering the electrode 9 to the electrode of the circuit board 2. Incidentally, it is possible to use any kind of connecting method for the aforementioned connection. However, when the adhesive resin layer 3 is not used to establish the flip chip connection as above, a resin must be inserted into a gap between the semiconductor chip 1 and the circuit board 2 and hardened, after these two are connected.

Then as FIG. 2(e) shows, the resin mold layer 10 is formed by sealing the surface (top surface), on which the semiconductor chip 1 is mounted, of the circuit board 2 by using a resin. This resin mold layer 10 is formed on an as needed basis. Conventional methods such as transfer molding and a method to harden a liquid resin by printing are possibly used as the method of resin molding.

Then as FIG. 2(e) shows, the moisture drain hole 7 is formed by applying from underneath a laser beam to an area of the bottom surface of the circuit board 2 where the tentative protective wire 11 is formed. The application of the laser beam is stopped when the laser beam removes a base material of the circuit board 2 and reaches the tentative protective wire 11.

Then as FIG. 3(a) shows, the solder ball 5 is mounted on the land (metal wire 4) for mounting the solder ball 5. That is to say, the solder ball 5 is provided in the perforation 6 and the solder ball 5 is connected to the land (metal wire 4) through the perforation 6. By the way, although in this embodiment the solder ball 5 is mounted after the moisture drain hole 7 is formed, this process may be done before the moisture drain hole 7 is formed.

Then as FIG. 3(b) shows, the pit part 8 is formed by removing the tentative protective wire 11 through the moisture drain hole 7 by etching. Since the tentative protective wire 11 is made of copper as mentioned above, Alcaetch (product name) made by Yamatoya & Co., Ltd, Aprocess (product name) made by Meltex Inc., etc. can be used to etch the tentative protective wire 11 without melting the solder ball 5.

The semiconductor device shown in FIG. 1(a) is acquired by the processes above. When the semiconductor device is mounted on another packaging substrate by reflowing, the semiconductor device can properly drain moisture through the pit part 8 and the moisture drain hole 7, even if the moisture included in the resin mold layer 10, the adhesive resin layer 3, and the circuit board 2 is evaporated and expanded.

In this embodiment, the pit part 8 formed on the adhesive resin layer 3, having the width wider than the diameter of the moisture drain hole 7 formed in the circuit board 2, can drain moisture more properly than the pit part 8 having the width as wide as the diameter of the moisture drain hole 7. Thus the moisture can properly be drained and this makes it possible to properly prevent, for instance, the adhesive resin layer 3 or the resin mold layer 10 from peeling off from the circuit board 2. Also, moisture resistance of the semiconductor chip 1 is not degraded, because the surface of the semiconductor chip 1 is covered with the adhesive resin layer 3 to be unexposed to the outside.

Moreover, when the laser beam which can do the operation efficiently is used to form the moisture drain hole 7 in the circuit board 2, it is easy to determine the endpoint of the penetrating operation by the laser beam, since the operation is supposed to end when the laser beam reaches the tentative protective wire 11. It is also possible to protect the semiconductor chip 1 from the application of the laser beam, since the laser beam cannot go further from the endpoint because of the tentative protective wire 11.

Therefore, the manufacturing method is preferably used particularly for the method to manufacture a semiconductor device using the flip chip type connection in which the connecting surface of the semiconductor chip 1 faces the circuit board 2.

Incidentally, the manufacturing method above is preferably arranged so that only the mounting surface of the land for mounting the solder ball 5 is plated with nickel and gold to improve the wettability at the moment of mounting the solder ball 5. Embodiment 2 described later illustrates a method in which the moisture drain hole 7 is formed in the circuit board 2 in advance. In this case, when the metal wire 4 made of copper is plated with nickel and gold, a part of the metal wire 4 exposed in the moisture drain hole 7 is also plated, and this obstructs the etching of the metal wire 4 in the following process. Thus it is required to treat the copper exposed in the moisture drain hole 7 not to be plated. Meanwhile, no special treatment of the metal wire 4 is necessary in the manufacturing method as in the present embodiment in which the moisture drain hole 7 can be formed in the final process (before the process to form the pit part 8 in actuality).

[Embodiment 2]

Figure 4:
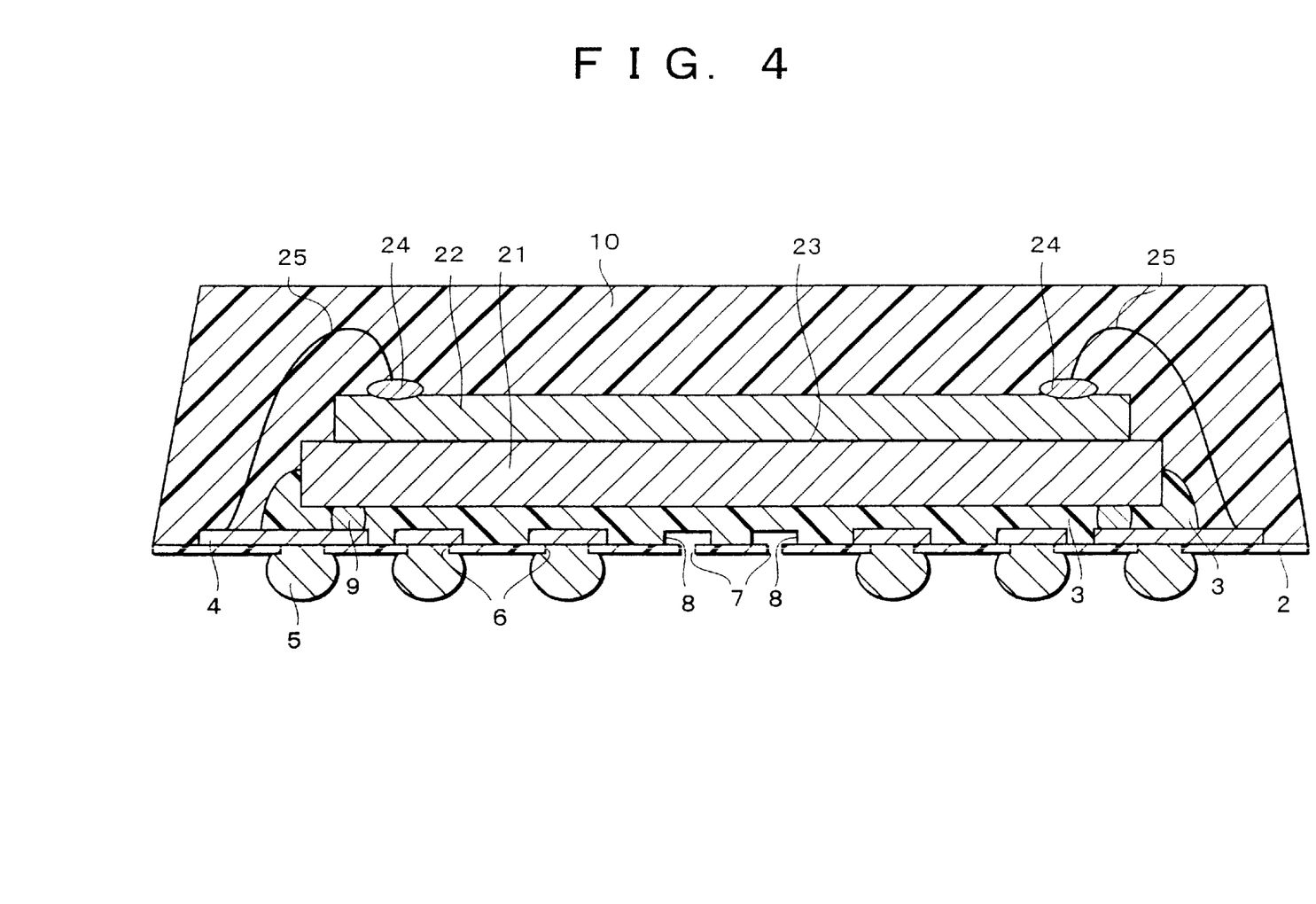
FIG. 4 is a vertical cross-sectional view, showing an arrangement of a semiconductor device of another embodiment of the present invention.

In accordance with FIGS. 4 and 5, another embodiment of the present invention is described.

As FIG. 4 shows, a semiconductor device of the present embodiment is arranged so that two-layered semiconductor chips, an upper semiconductor chip 21 and a lower semiconductor chip 22, is provided. The semiconductor chip 21 is provided on a circuit board 2 by using the flip chip connection as in the case of the semiconductor chip 1, and the semiconductor chip 22 is provided on the semiconductor chip 21, with the non-connecting surface thereof down. The semiconductor chips 21 and 22 are adhered to each other by an inter-chip adhesive layer 23. The semiconductor chip 22 has multiple numbers of electrodes 24 on the top surface thereof, and each of these electrodes 24 is connected to a metal wire 4 on the circuit board 2 by wire bonding using a wire 25. An arrangement of other sections of this semiconductor device, such as a moisture drain hole 7 provided in the circuit board 2, an adhesive resin layer 3 including a pit part 8, etc. is identical with the arrangement of the aforementioned semiconductor device shown in FIG. 1(a).

A manufacturing method of the semiconductor device arranged as above is described. Incidentally, the manufacturing method below can be applied to a semiconductor device only including the semiconductor chip 21, i.e. the semiconductor device shown in FIG. 1(a).

Figure 5A:
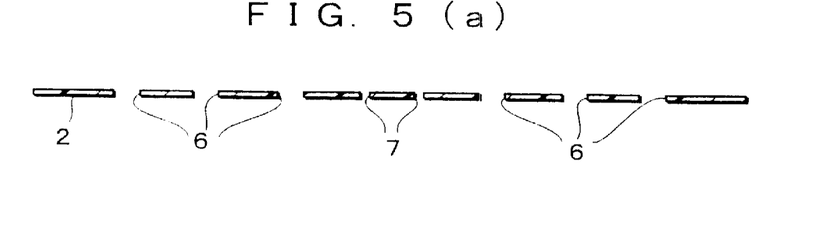
FIG. 5(a) shows a manufacturing method of the semiconductor device shown in FIG. 4, and is a vertical cross-sectional view showing a process to form a perforation for mounting a solder ball and a moisture drain hole through a circuit board.

First of all, as FIG. 5(a) shows, a perforation 6 for mounting a solder ball 5 and a moisture drain hole 7 are formed on the circuit board 2 (base material to be the circuit board 2). It is possible to form the perforation 6 and the moisture drain hole 7 by a drill or a laser beam, punching by using a die, etc.

Figure 5B:
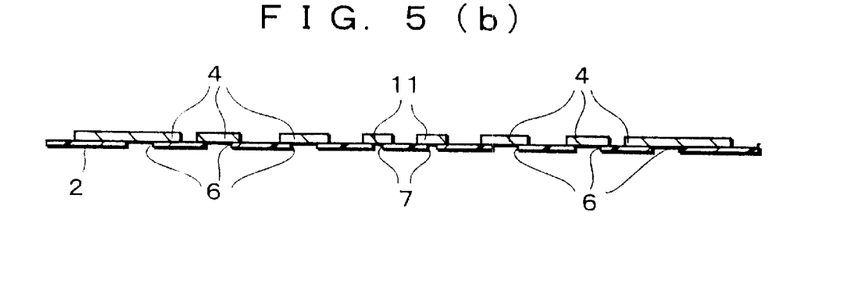
FIG. 5(b) shows a manufacturing method of the semiconductor device shown in FIG. 4, and is a vertical cross-sectional view showing a process to form a metal wire and a tentative protective wire on the circuit board.

The circuit board 2 (base material to be the circuit board 2) is laminated with a copper film, and then as FIG. 5(b) shows, the copper film is etched and the metal wire 4 and a tentative protective wire 11 are formed on the surface of the circuit board 2 which is for mounting the semiconductor device 1. The metal wire 4 is connected to a land for mounting the solder ball 5. In the circuit board 2, the metal wire 4 on the top surface of the circuit board 2 is formed to cover the perforation, and the tentative protective wire 11 is formed on the top surface to cover the moisture drain hole 7. Moreover, at least one tentative protective wire 11 is formed to link multiple numbers of the moisture drain hole 7.

Generally the metal wire 4 and the tentative protective wire 11 are made of copper. Also, the metal wire 4 is plated with nickel and gold on an as-needed basis, and the tentative protective wire 11 is treated not to be plated in the process of plating the metal wire 4. By the way, a top surface of the metal wire 4 is preferably a gold layer, for a possible reductions in resistance in the flip chip connection.

Figure 5C:
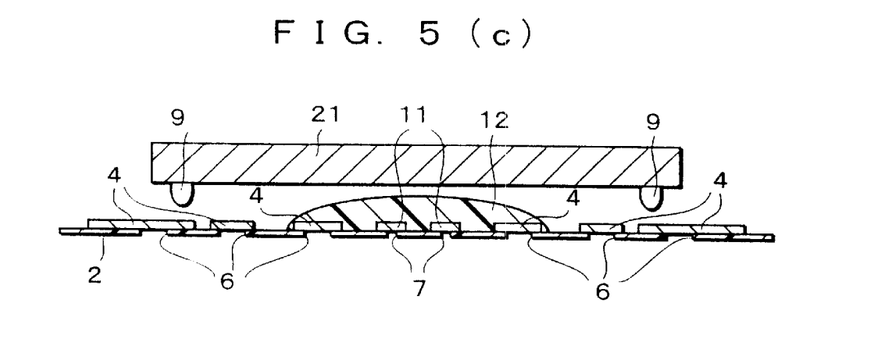
FIG. 5(c) shows a manufacturing method of the semiconductor device shown in FIG. 4, and is a vertical cross-sectional view showing a process to mount a first semiconductor chip on the circuit board.

Then as FIG. 5(c) shows, an anisotropic conductive adhesive resin 12 to be the adhesive resin layer 3 is provided on the circuit board 2, as in the aforementioned process shown in FIG. 2(c).

Then a protrusive electrode 9 formed on an electrode of the semiconductor chip 21 is aligned with an electrode of the circuit board 2, then these two are caused to touch with each other and heated to harden the anisotropic conductive adhesive resin 12 to form the adhesive resin layer 3. The connection between the protrusive electrode 9 and the electrode of the circuit board 2 is as described in Embodiment 1.

Figure 5D:
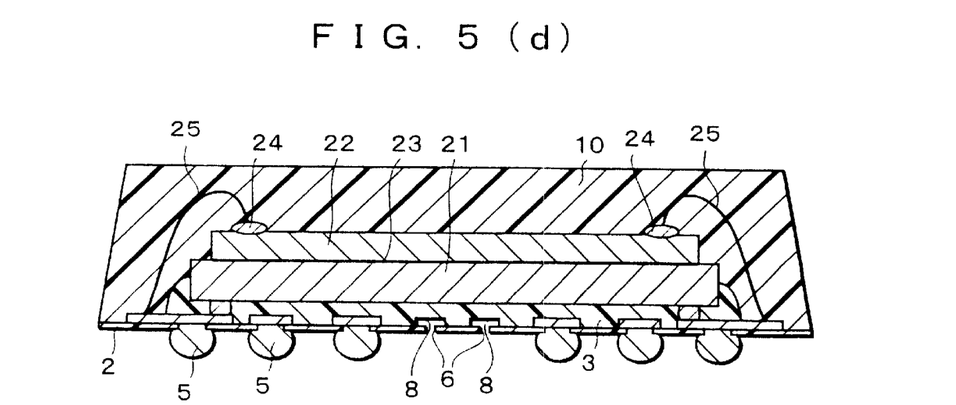
FIG. 5(d) shows a manufacturing method of the semiconductor device shown in FIG. 4, and is a vertical cross-sectional view showing the semiconductor device which is manufactured by mounting a second semiconductor chip on the first semiconductor chip.

Then as FIG. 5(d) shows, the semiconductor chip 22 is mounted on the top surface (non-connecting surface) of the semiconductor chip 21 with non-connecting surface of the chip 22 down, and these two are adhered to each other by the inter-chip adhesive layer 23. An adhesive sheet or paste is used as the inter-chip adhesive layer 23.

Then the electrode 24 of the semiconductor chip 22 is connected to the circuit board 2 by the wire bonding using the wire 25.

Then the surface of the circuit board 2 for mounting the semiconductor chip is coated with the resin mold layer 10.

Thereafter the solder ball 5 is mounted as in the aforementioned process, and at the same time the pit part 8 is formed by removing the tentative protective wire 11 by etching through the moisture drain hole 7.

The semiconductor device shown in FIG. 4 is acquired by the processes above. This semiconductor device drains moisture by the moisture drain hole 7 and the pit part 8 as efficiently as the aforementioned semiconductor device. Moreover, the semiconductor chip 21 manufactured by this method is protected by the tentative protective wire 11 as is the semiconductor chip of the aforementioned manufacturing method, at the moment of forming the moisture drain hole 7 by using a laser beam etc.

[Embodiment 3]

Figure 6:
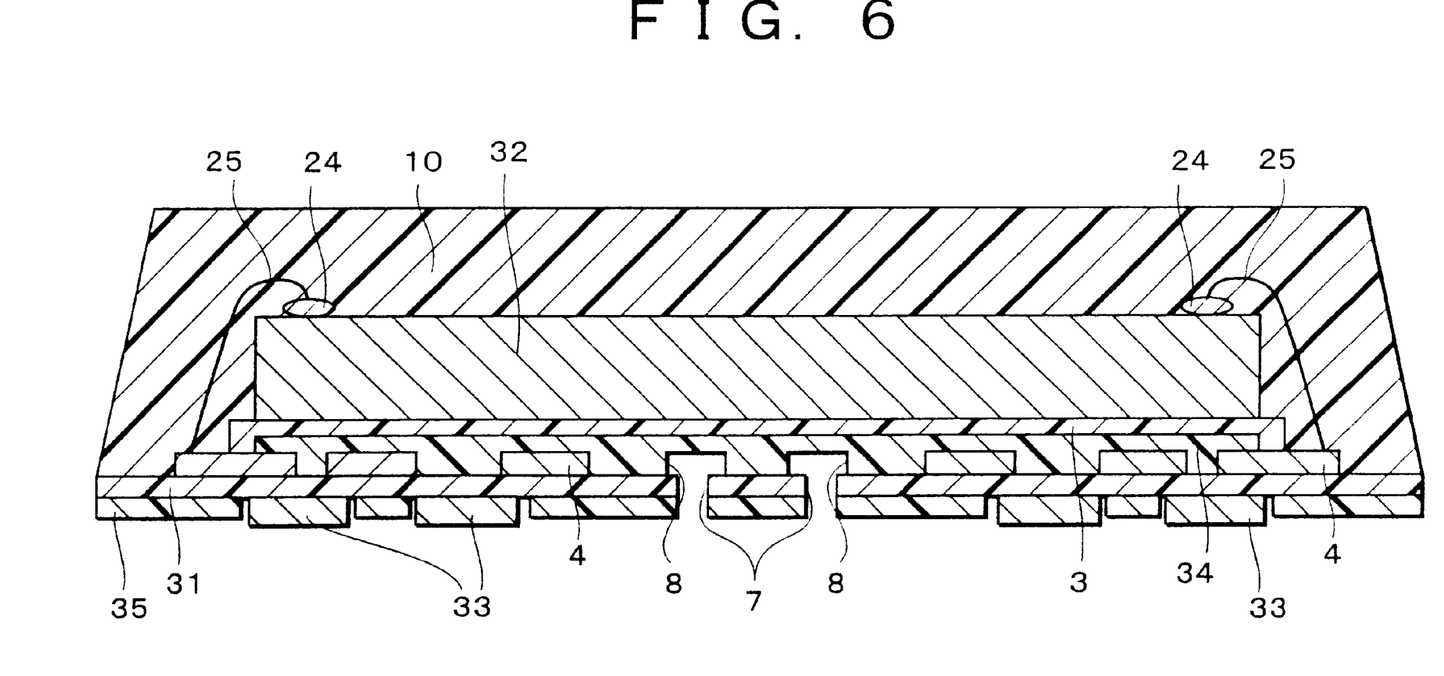
FIG. 6 is a vertical cross-sectional view, showing an arrangement of a semiconductor device of another embodiment of the present invention.
Figure 7A:
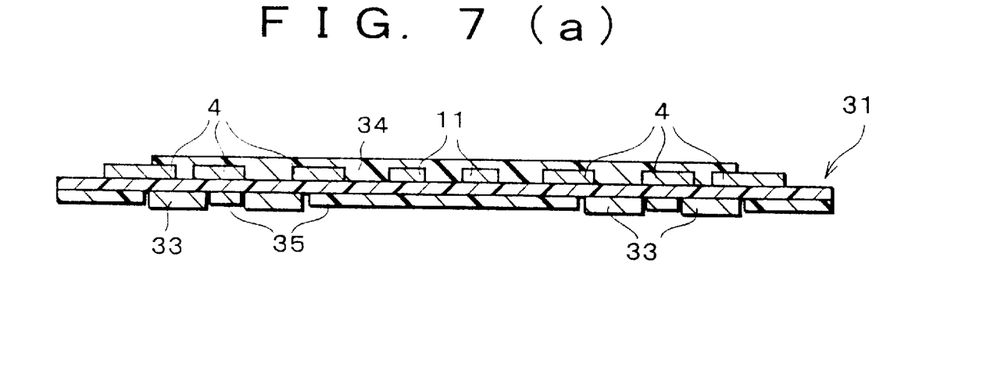
FIG. 7(a) shows a manufacturing method of the semiconductor device shown in FIG. 6, and is a vertical cross-sectional view showing a process to form a metal wiring, a tentative protective wire, a land, and a solder resist layer on a circuit board.
Figure 7B:
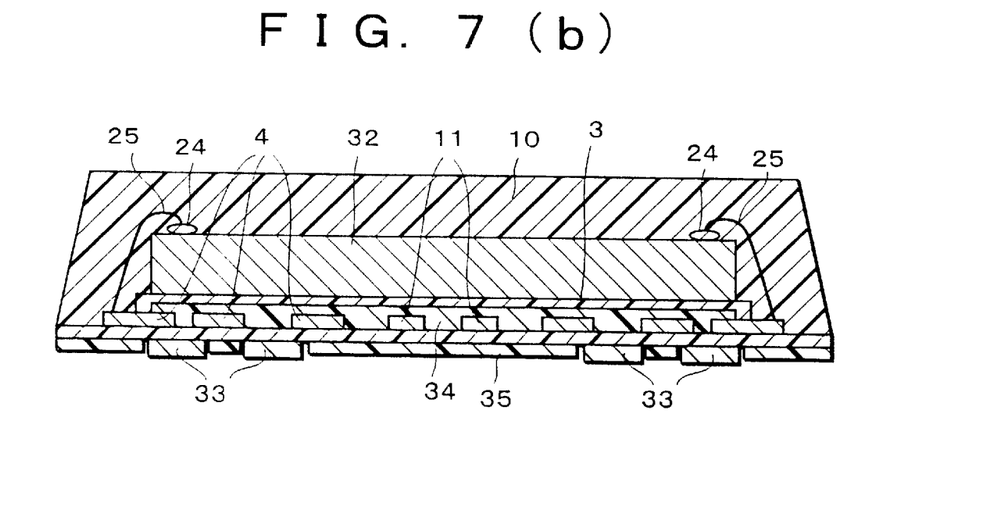
FIG. 7(b) shows a manufacturing method of the semiconductor device shown in FIG. 6, and is a vertical cross-sectional view showing a process to mount a semiconductor chip on the circuit board and resin-mold the same.
Figure 7C:
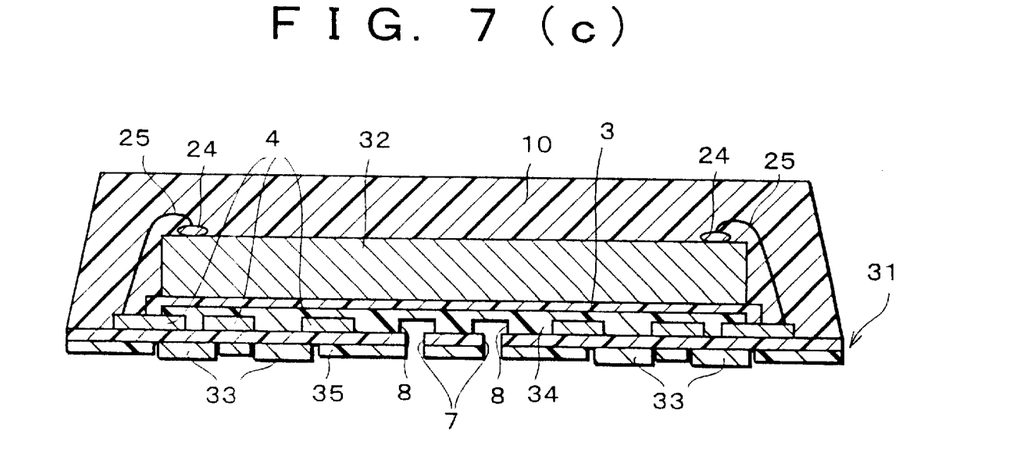
FIG. 7(c) shows a manufacturing method of the semiconductor device shown in FIG. 6, and is a vertical cross-sectional view showing the semiconductor device which is manufactured by forming a moisture drain hole and a pit part.

In accordance with FIGS. 6 and 7, another embodiment of the present invention is described.

As FIG. 6 shows, a semiconductor device of the present embodiment is arranged so that a double-sided circuit board 31 is provided and further a wire bonding type semiconductor chip 32 is mounted thereon.

Although the figure shows that a solder resist 34 is formed on the double-sided circuit board 31, this is not always necessary. Incidentally, when the solder resist 34 is not formed, for instance, the adhesive resin layer 3 is also formed in an area in which the solder resist 34 is supposed to be formed and the pit part 8 is formed in this adhesive resin layer 3.

A metal wire 4 is formed on the top surface (surface for mounting the semiconductor chip 32) of the double-sided circuit board 31, and on the bottom surface thereof, a land 33 for mounting a solder ball 5 which is an output terminal is formed. Incidentally, although an arrangement described here is a case that the semiconductor device includes the double-sided circuit board 31 in which each of the top and bottom surface has a layer of the circuit pattern (metal wire 4, land 33), the semiconductor device may be arranged so that a multi-layered board having not less than three layers of circuit patterns is provided, instead of the double-sided circuit board 31.

In the present semiconductor device, the metal wire 4 is formed on the top surface of the double-sided circuit board 31, and further above, a solder resist layer (intermediate layer) 34 is formed. The land 33 is formed on the bottom surface of the double-sided circuit board 31, and a solder resist layer 35 is formed between the lands 33.

A moisture drain hole 7 is formed in the double-sided circuit board 31, and also a pit part 8 is formed in the solder resist layer 34 of the board 31.

Moreover, the semiconductor chip 32 is mounted on the double-sided circuit board 31 via an adhesive resin layer 3, and an electrode 24 of the semiconductor chip 32 is connected to the double-sided circuit board 31 by a wire 25 (wire bonding).

A manufacturing method of the present invention arranged as above is described below.

First of all, on the top surface of the double-sided circuit board 31 (base material to be the double-sided circuit board 31), the metal wire 4 is formed and at the same time the tentative protective wire 11 is formed to cover an area where the moisture drain hole 7 is formed in the following process, as FIG. 7(a) shows. Also on the bottom surface of the double-sided circuit board 31 (base material to be the double-sided circuit board 31), the land 33 for mounting the solder ball 5 is formed. The metal wire 4 and the land 33 are generally made of copper.

Then on the top surface of the double-sided circuit board 31, the solder resist layer 34 is formed on the metal wire 4 and the tentative protective wire 11, and on the bottom surface of the double-sided circuit board 31, the solder resist layer 35 is formed between the lands 33.

The metal wire 4 is plated with nickel and gold. To conduct the wire bonding, the top surface of the metal wire 4 is preferably a gold layer. The nickel and gold plating is done after the solder resist layers 34 and 35 are formed. On this account, the tentative protective wire 11 is not plated and hence moisture can be drained properly, since nickel and gold do not remain in the solder resist layer 34 when the tentative protective wire 11 made of copper is etched in the following process.

Then as FIG. 7(b) illustrates, an adhesive (generally provided as sheet or paste) to be the adhesive resin layer 3 is provided for the double-sided circuit board 31. The method of the provision is as above.

Then the semiconductor chip 32 is mounted on the adhesive resin layer 3, and the electrode 24 of the semiconductor chip 32 and the double-sided circuit board are connected by the wire 25 (wire bonding).

Then the resin mold layer 10 is formed on the surface, for mounting the semiconductor chip 32, of the double-sided circuit board 31, and the semiconductor chip 32 and the wire 25 are coated. The method to form the resin mold layer 10 is as above.

Then as FIG. 7(c) shows, the moisture drain hole 7 is formed by using a laser beam. The method to form the moisture drain hole 7 is as above.

Then the tentative protective wire 11 is removed by etching through the moisture drain hole 7, and the pit part 8 is formed. The type of etching liquid available in this process is as above.

The semiconductor device shown in FIG. 6 is acquired by the processes above. The way of packaging this semiconductor device is termed a land grid array package. This semiconductor device drains moisture by the moisture drain hole 7 and the pit part 8 as efficient as the aforementioned semiconductor device. Moreover, the semiconductor chip 32 manufactured by this method is protected by the tentative protective wire 11 as is the semiconductor chip of the aforementioned manufacturing method, at the moment of forming the moisture drain hole 7 by using a laser beam etc.

A semiconductor device of the present invention may be arranged so that moisture drain holes are formed and then a pit part is formed to link the same.

According to this arrangement, the semiconductor device can effectively drain moisture through the pit part and the drain holes, since the drain holes formed through a circuit board are linked by the pit part formed in an intermediate layer.

The semiconductor device of the present invention may be arranged so that a semiconductor chip is coated with a mold resin layer.

According to this arrangement, The semiconductor device can properly drain moisture through the pit part and the moisture drain holes, even if the semiconductor chip is coated with the mold resin layer. A manufacturing method of the semiconductor device may be arranged so that in a step to form a tentative protective wire and the moisture drain hole, the moisture drain holes are formed and the tentative protective wire is formed to link the same.

According to this arrangement, the pit part formed in the intermediate layer by removing the tentative protective wire links the moisture drain holes, since the moisture drain holes formed through the circuit board are linked by the tentative protective wire. On this account, the semiconductor device can efficiently drain moisture through the pit part and the moisture drain holes.

The manufacturing method of the semiconductor device of the present invention may be arranged so that the tentative protective wire is formed together with another wire in a single step from a common material with another wire.

According to this arrangement, the step to form the tentative protective wire can be included in the step of forming the circuit board. On this account, an increase of the numbers of steps can be avoided.

The manufacturing method of the semiconductor device of the present invention may be arranged so that the moisture drain hole is formed using a laser beam.

That is to say, the manufacturing method of the semiconductor device is suitable for an arrangement to form the moisture drain hole using a laser beam which can efficiently do the operation, and the manufacturing method can certainly prevent the semiconductor chip from being damaged and features thereof from being deteriorated that are caused by projection of the laser beam thereon.

The manufacturing method of the semiconductor device of the present invention may be arranged so that the semiconductor chip is a flip chip.

That is to say, the manufacturing method of the semiconductor device is suitable for an arrangement to mount the semiconductor chip on the circuit board by making a connecting face thereof face the circuit board (flip chip), and the manufacturing method can certainly prevent the connecting face of the semiconductor chip from being damaged etc. in the step of forming the moisture drain hole.

The present invention provides a semiconductor device that can certainly and effectively drain moisture to the outside when reflowing and adopt various connecting methods using well-fluid adhesives, and the manufacturing method thereof.

Metal wires are formed on a face of the circuit board which is for mounting a semiconductor chip, and further some of the wires are formed to cover a moisture drain hole formed in the following step. A perforation for mounting a solder ball may be formed in the following step, instead of being formed in this step. Also, apart from a connecting terminal, a solder resist layer may be formed on the wires on the face, on which the semiconductor chip is mounted, of the circuit board on an as-needed basis.

An adhesive sheet or paste is provided on the circuit board as an intermediate layer, and then the semiconductor chip is mounted using a die bond paste and a die bond sheet in the case of wire bonding, or via an anisotropic conductive adhesive or an insulating adhesive in the case of a flip chip. Alternatively, a liquid sealing resin termed underfill agent can be inserted and hardened in an interface between the circuit board and the semiconductor chip, when the semiconductor chip is mounted by the flip chip connection without using these adhesives. The connecting methods and the materials are not limited to those shown here.

Then on an as-needed basis, the face is molded with a resin and the solder ball is mounted on a part of the circuit board, which is for mounting the solder ball.

Then a moisture drain hole is formed through the circuit board in a place where a tentative protective wire to be removed is formed, using a laser beam and a drill. The laser beam only penetrates the circuit board and is stopped at the tentative protective wire, since the tentative protective wire is formed on the face of the circuit board.

Then the tentative protective wire is removed by etching through the moisture drain hole. On account of this, it is possible to form the moisture drain hole, having a diameter larger than that of the hole created using a laser beam or a drill, in the intermediate layer, and hence moisture can effectively be drained to the outside when reflowing. Moreover, it is possible to keep reliability of the semiconductor device since the surface of the semiconductor chip is not exposed to the outside-air.

Furthermore, if the tentative protective wire is formed to link the moisture drain holes, a pit part can be formed like canals in the intermediate layer, and hence moisture can be drained more effectively when reflowing. Moreover, washing after the etching can be done more easily.

Alternatively, the perforation for mounting the solder ball and the moisture drain hole are formed through the circuit board in advance. These holes can be formed by drilling, projection of a laser beam, or punching etc. Then a film such as a copper film is pasted on the circuit board to form the tentative protective wire and a specified wiring pattern which is necessary for the circuit board. In this process, the tentative protective wire has to cover a mouth of the moisture drain hole opened on the face of the circuit board. Then the semiconductor chip is mounted on the circuit board and the face, on which the semiconductor chip is mounted, of the circuit board is molded with a resin on an as-needed basis. There are some ways of mounting the semiconductor chip such as the wire bonding and the flip chip technique, and an adhesive resin sheet or liquid (intermediate layer) can be used in the flip chip structure as well. Then to form an output terminal, a solder ball for the same is formed in a specified place which is made into the output terminal. Then the tentative protective wire is removed by etching through the moisture drain hole.

By the processes above, it is possible to form the moisture drain hole and the pit part that make it possible to drain moisture effectively when reflowing, and also to adopt a mounting method of the semiconductor device using an adhesive resin with high fluidity as the intermediate layer.

A metal wire of the circuit board is generally plated with nickel and gold to reduce resistance thereof when connected in the flip chip connection and to enable wire bonding. However, a part of the tentative protective wire, exposing in the moisture drain hole opened on the face for mounting the solder ball, is preferably not plated, since the tentative protective wire is etched in the following step.

Thus in the case of forming the moisture drain hole through the circuit board in advance, it is preferable to treat a part of the tentative wire exposing in the moisture drain hole, for instance, cover the part by a resist and removing the same after the plating, to prevent the part from being plated in the plating process.

Moreover, the passageway to drain moisture becomes larger and the draining becomes easier, since either the width of the tentative protective wire removed through the moisture drain hole by etching is wider than the diameter of the moisture drain hole, or the tentative protective wire is wider than the diameter of the same. Also, an area of the intermediate layer facing the pit part becomes larger since the tentative protective wire is formed to link the moisture drain holes and then the wire is removed by etching. As a result, moisture can be drained more easily too.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device, comprising:
    a circuit board provided with at least one moisture drain hole formed therethrough;
    a semiconductor chip mounted on the circuit board via at least an intermediate layer,
    a metal wire formed on a surface of the circuit board facing the intermediate layer; and
    wherein a pit part having a width wider than a diameter of the at least one moisture drain hole is formed in a part of the intermediate layer facing the at least one moisture drain hole, and wherein the semiconductor chip and the metal wire are not exposed to the pit part.

2. The semiconductor device as set forth in claim 1, wherein the pit part is formed to link a plurality of the moisture drain holes.

3. The semiconductor device as set forth in claim 1, wherein the semiconductor chip is coated with a mold resin layer.

4. The semiconductor device as set forth in claim 1, wherein the semiconductor chip is a flip chip.

5. A semiconductor device, comprising:
    a circuit board provided with at least one moisture drain hole formed therethrough;
    a semiconductor chip mounted on the circuit board via at least an intermediate layer,
    a metal wire formed on a surface of the circuit board facing the intermediate layer, wherein the metal wire is formed over an aperture defined in the circuit board, and an output terminal is provided at a surface of the circuit board opposite the metal wire and is in electrical communication with the metal wire via the aperture defined in the circuit board; and
    wherein a pit part having a width wider than a diameter of the at least one moisture drain hole is formed in the intermediate layer over the at least one moisture drain hole, and wherein the semiconductor chip and the metal wire are not exposed to the pit part.

6. A semiconductor device as set forth in claim 1, wherein the pit part is formed with a groove-like shape.

7. The semiconductor device as set forth in claim 1, wherein the pit part is formed to link the at least one moisture drain hole.

8. A manufacturing method of a semiconductor device including a circuit board provided with at least one moisture drain hole formed therethrough and a semiconductor chip mounted on a face thereof via an intermediate layer, comprising the steps of:
    (a) forming a tentative protective wire for covering a mouth of the at least one moisture drain hole opened on the face on an area of the face where the at least one moisture drain hole is formed;
    (b) after step (a), mounting the semiconductor chip on the face via the intermediate layer;
    (c) after step (a), forming the at least one moisture drain hole through the circuit board from a face, of the circuit board, opposite to the face; and
    (d) after step (b), removing the tentative protective wire through the at least one moisture drain hole.

9. The manufacturing method of the semiconductor device as set forth in claim 8, wherein in steps (a) and (c), the tentative protective wire is formed to link the at least one moisture drain hole.

10. The manufacturing method of the semiconductor device as set forth in claim 8, wherein the tentative protective wire is formed together with another wire in a single step from a common material with another wire.

11. The manufacturing method of the semiconductor device as set forth in claim 8, wherein the at least one moisture drain hole is formed using a laser beam.

12. The manufacturing method of the semiconductor device as set forth in claim 8, wherein the semiconductor chip is a flip chip.

13. A manufacturing method of a semiconductor device including a circuit board provided with at least one moisture drain hole formed therethrough and a semiconductor chip mounted on a face thereof via an intermediate layer, comprising the steps of:
    (a) forming the at least one moisture drain hole on the face;
    (b) after step (a), forming on the face a tentative protective wire for covering a mouth of the at least one moisture drain hole opened on the face;
    (c) after step (b), mounting the semiconductor chip on the face via the intermediate layer; and
    (d) after step (c), removing the tentative protective wire through the at least one moisture drain hole.

14. The manufacturing method of the semiconductor device as set forth in claim 13, wherein in steps (a) and (b), the tentative protective wire is formed to link the at least one moisture drain hole.

15. The manufacturing method of the semiconductor device as set forth in claim 13, wherein the at least one moisture drain hole is formed using a laser beam.

16. The manufacturing method of the semiconductor device as set forth in claim 13, wherein the semiconductor chip is a flip chip.

17. A manufacturing method of a semiconductor device including a circuit board provided with at least one moisture drain hole formed therethrough and a semiconductor chip mounted on a face thereof via an intermediate layer, comprising the steps of:
    (a) forming a tentative protective wire and the at least one moisture drain hole, the tentative protective wire being formed for covering a mouth of the at least one moisture drain hole opened on the face, and the at least one moisture drain hole being formed through the circuit board;
    (b) after step (a), mounting the semiconductor chip on the face via an intermediate layer;
    (c) after step (b), removing the tentative protective wire through the at least one moisture drain hole.

18. The manufacturing method of the semiconductor device as set forth in claim 17, wherein in step (a), the tentative protective wire is formed to link the at least one moisture drain hole.

19. The manufacturing method of the semiconductor device as set forth in claim 17, wherein the tentative protective wire is formed together with another wire in a single step from a common material with another wire.

20. The manufacturing method of the semiconductor device as set forth in claim 17, wherein the at least one moisture drain hole is formed using a laser beam.

21. The manufacturing method of the semiconductor device as set forth in claim 17, wherein the semiconductor chip is a flip chip.

* * * * *